(12) United States Patent
Bhatia et al.

(10) Patent No.: US 7,420,997 B2
(45) Date of Patent: Sep. 2, 2008

(54) WAVELENGTH CONTROL IN WAVELENGTH SELECTIVE, PHASE, AND GAIN REGIONS OF SEMICONDUCTOR LASERS

(75) Inventors: Vikram Bhatia, Painted Post, NY (US); Jacques Gollier, Painted Post, NY (US); Martin Hai Hu, Painted Post, NY (US); David August Sniezek Loeber, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/900,761

(22) Filed: Sep. 13, 2007

(65) Prior Publication Data

US 2008/0089370 A1   Apr. 17, 2008

Related U.S. Application Data

(60) Provisional application No. 60/883,648, filed on Jan. 5, 2007, provisional application No. 60/829,631, filed on Oct. 16, 2006.

(51) Int. Cl.
*H01S 3/00* (2006.01)
(52) U.S. Cl. .............................. 372/38.07; 372/29.015; 372/43.01
(58) Field of Classification Search ............... 372/38.07
See application file for complete search history.

(56) References Cited

U.S. PATENT DOCUMENTS

| | | | |
|---|---|---|---|
| 5,473,625 A | 12/1995 | Hansen et al. | 372/96 |
| 6,058,128 A | 5/2000 | Ventrudo | 372/96 |
| 6,215,809 B1 | 4/2001 | Ziari et al. | 372/96 |
| 6,222,861 B1 | 4/2001 | Kuo et al. | 372/20 |

(Continued)

FOREIGN PATENT DOCUMENTS

WO    WO2005/091450    9/2005

(Continued)

OTHER PUBLICATIONS

Y, Kitaoka "Wavelength stabilization of a distributed Bragg reflector laser diode by use of complementary current injection," Optics Letters/ vol. 28, No. 11/ Jun. 1, 2003, pp. 914-916.

*Primary Examiner*—Dung T Nguyen
(74) *Attorney, Agent, or Firm*—Kwadjo Adusei-Poku; Dinsmore & Shohl LLP

(57) ABSTRACT

Particular embodiments of the present invention relate generally to semiconductor lasers and laser scanning systems and, more particularly, to schemes for controlling semiconductor lasers. According to one embodiment of the present invention, a laser is configured for optical emission of encoded data. At least one parameter of the optical emission is a function of a drive current $I_{GAIN}$ injected into the gain section of the semiconductor laser and one or more additional drive currents $I/V_{PHASE}$, $I/V_{DBR}$. Mode selection in the semiconductor laser is altered by perturbing at least one of the additional drive currents $I/V_{PHASE}$, $I/V_{DBR}$ with a perturbation signal $I/V_{PTRB}$ to alter mode selection in the semiconductor laser such that a plurality of different emission modes are selected in the semiconductor laser over a target emission period. In this manner, patterned variations in the wavelength or intensity profile of the laser can be disrupted to disguise patterned flaws that would otherwise be readily noticeable in the output of the laser.

23 Claims, 8 Drawing Sheets

U.S. PATENT DOCUMENTS

| | | | |
|---|---|---|---|
| 6,738,398 B2 | 5/2004 | Hirata et al. | 372/32 |
| 7,010,006 B2 * | 3/2006 | Kasazumi et al. | 372/29.02 |
| 2004/0086012 A1 | 5/2004 | Kitaoka, et al. | 372/43 |
| 2004/0264525 A1 | 12/2004 | Senga et al. | 372/38.1 |
| 2006/0209913 A1 | 9/2006 | Yokoyama et al. | 372/29.011 |

FOREIGN PATENT DOCUMENTS

| | | |
|---|---|---|
| WO | WO2006/060656 | 6/2006 |

* cited by examiner

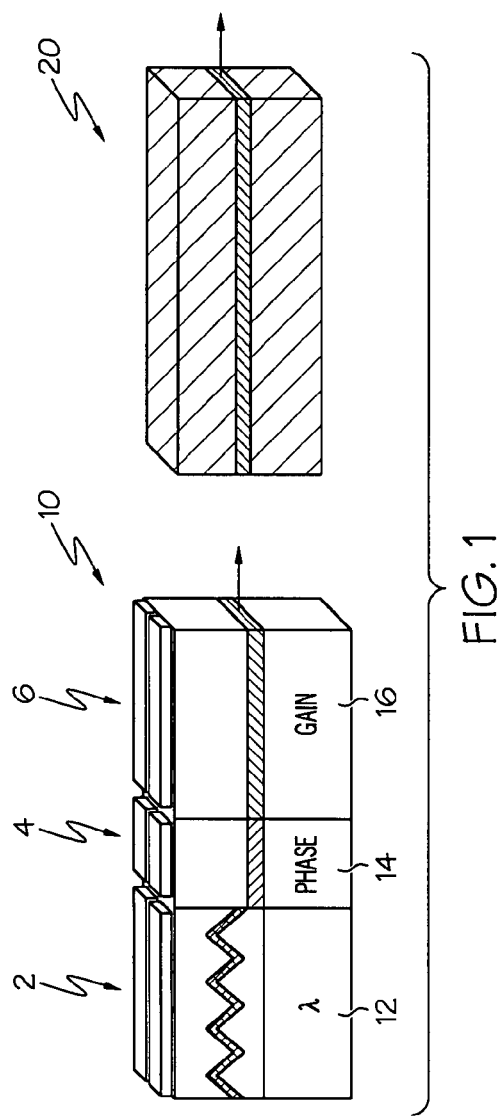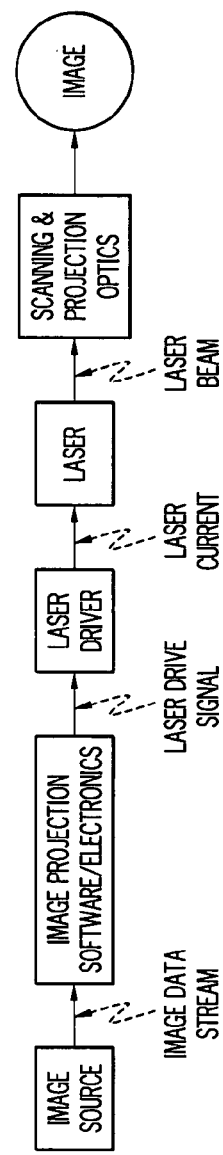

WAVELENGTH CONTROL IN WAVELENGTH
SELECTIVE, PHASE, AND GAIN REGIONS
OF SEMICONDUCTOR LASERS

CROSS REFERENCE TO RELATED APPLICATIONS

This application claims the benefit of U.S. Provisional Application Ser. Nos. 60/829,631, filed Oct. 16, 2006, and 60/883,648, filed Jan. 5, 2007, for WAVELENGTH CONTROL IN THE WAVELENGTH SELECTIVE, PHASE, AND GAIN REGIONS OF SEMICONDUCTOR LASERS. The present application is also related to copending and commonly assigned U.S. patent application Ser. No. 11/549,856, filed Oct. 16, 2006, for WAVELENGTH CONTROL IN SEMICONDUCTOR LASERS, but does not claim priority thereto.

BACKGROUND OF THE INVENTION

The present invention relates generally to semiconductor lasers, laser controllers, laser projection systems, and other optical systems incorporating semiconductor lasers. More particularly, some embodiments of the present invention relate to schemes for managing laser wavelength variations in semiconductor lasers. Other embodiments of the present invention relate to schemes for disrupting the temperature evolution signature of a semiconductor laser and schemes for minimizing systematic wavelength variations in the output of a wavelength conversion device optically coupled to a semiconductor laser.

SUMMARY OF THE INVENTION

The present invention relates generally to semiconductor lasers, which may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, or a Fabry-Perot laser with a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of an SHG crystal, such as MgO-doped periodically poled lithium niobate (PPLN), is strongly dependent on the wavelength matching between the laser diode and the SHG device. As will be appreciated by those familiar with laser design, DFB lasers are resonant-cavity lasers using grids or similar structures etched into the semiconductor material as a reflective medium. DBR lasers are lasers in which the etched grating is physically separated from the electronic pumping area of the semiconductor laser. SHG crystals use second harmonic generation properties of non-linear crystals to frequency double laser radiation.

The bandwidth of a PPLN SHG device is often very small—for a typical PPLN SHG wavelength conversion device, the full width half maximum (FWHM) wavelength conversion bandwidth is only in the 0.16 to 0.2 nm range and mostly depends on the length of the crystal. Mode hopping and uncontrolled large wavelength variations within the laser cavity can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops. In laser projection systems, for example, mode hops are particularly problematic because they can generate instantaneous changes in power that will be readily visible as defects at specific locations in the image. These visible defects typically manifest themselves as organized, patterned image defects across the image because the generated image is simply the signature of the temperature evolution of the different sections of the laser.

Given the challenges associated with wavelength matching and stabilization in developing semiconductor laser sources, the present inventors have recognized beneficial schemes for managing laser wavelength variations in semiconductor lasers. The present inventors have also recognized beneficial schemes for managing systematic wavelength variations in the output of a wavelength conversion device optically coupled to a semiconductor laser by disrupting the unfavorable temperature evolution signature of the laser.

The present inventors have recognized that although the concepts of the present invention are described primarily in the context of DBR lasers, it is contemplated that the control schemes discussed herein will also have utility in a variety of types of semiconductor lasers, including but not limited to DFB lasers, Fabry-Perot lasers, and many types of external cavity lasers. It is also noted that, particular embodiments of the present invention relate to wavelength stabilization in laser sources in general, without regard to whether second harmonic generation is utilized in the laser source.

According to one embodiment of the present invention, a method of controlling a semiconductor laser is provided. According to the method, at least one of the sections of the semiconductor laser is modulated to provide image data. For example, and not by way of limitation, in the case of laser projection, the gain current $I_{GAIN}$ can be modulated to generate grey levels in the projected image. This modulation generates some fluctuation of the laser wavelength, which results in a variation of the projected light. In the context of a relatively stationary image, the wavelength fluctuation will repeat itself frame-by-frame, resulting in a systematic and organized image bias that can easily be detected by the human eye. Some embodiments of the present invention manage this issue by utilizing in the laser one or multiple additional signals in such a way that the image bias becomes non-organized and therefore, much harder to detect with human eyes.

According to additional embodiments of the present invention, methods of controlling laser projection systems incorporating semiconductor lasers and laser controllers programmed to execute such methods are contemplated. More specifically, according to one embodiment of the present invention, a method of controlling a laser projection system is provided. The method comprises (i) generating at least a portion of a scanned laser image by configuring the semiconductor laser for optical emission of encoded image data and scanning an output beam of the visible light source across a plurality of image pixels or encoded data period; and (ii) altering mode selection in the semiconductor laser as the output beam is scanned across the image pixels or encoded data periods by perturbing at least one of the drive currents $I/V_{PHASE}$, $I/V_{DBR}$ with a perturbation signal $I/V_{PTRB}$. The perturbation signal $I/V_{PTRB}$ comprises an amplitude profile that varies significantly enough over time to alter mode selection in the semiconductor laser such that a plurality of different emission modes are selected in the semiconductor laser as the output beam is scanned across the image pixels or encoded data periods.

According to another embodiment of the present invention, a laser projection system is provided comprising a controller that is programmed to (i) generate at least a portion of a scanned laser image by operating the semiconductor laser for optical emission of encoded image data and scanning an output beam of the visible light source across a plurality of image pixels or encoded data periods; and (ii) alter mode selection in the semiconductor laser as the output beam is scanned across the image pixels or encoded data periods by perturbing at least one of the additional drive currents $I/V_{PHASE}$, $I/V_{DBR}$ with a perturbation signal $I/V_{PTRB}$.

Although the concepts of the present invention are described primarily in the context of image forming, it is contemplated that various concepts of the present invention may also be applicable to any laser application where repeatable, low frequency fluctuation of the laser wavelength is a problem.

BRIEF DESCRIPTION OF THE DRAWINGS

The following detailed description of specific embodiments of the present invention can be best understood when read in conjunction with the following drawings, where like structure is indicated with like reference numerals and in which:

FIG. 1 is a schematic illustration of a DBR or similar type semiconductor laser optically coupled to a light wavelength conversion device;

FIG. 2 is a schematic illustration of a laser projection system according to one embodiment of the present invention;

DETAILED DESCRIPTION

Figure 3:
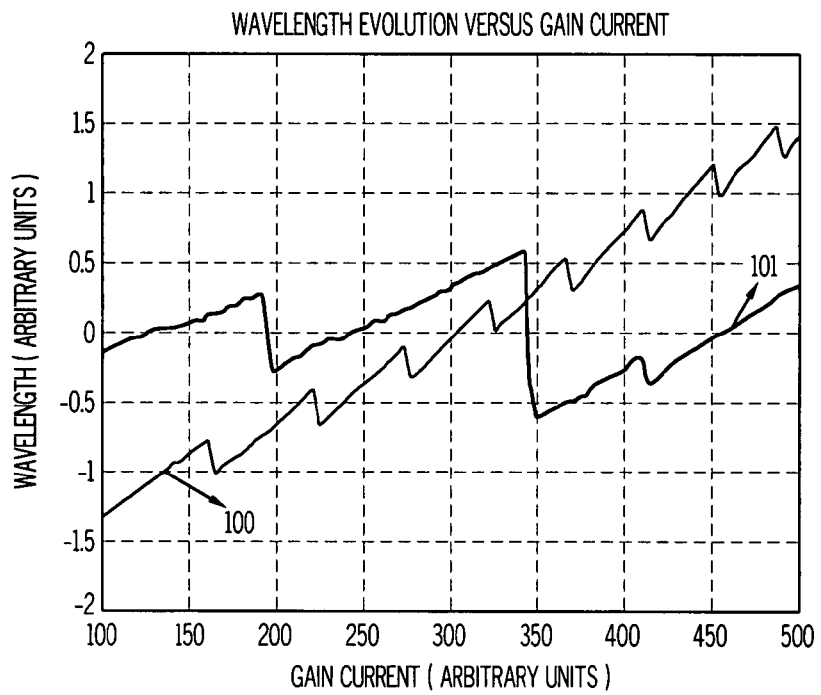
FIGS. 3 and 4 illustrate the evolution of emission wavelength as a function of gain current in a DBR laser.

Although the specific structure of the various types of semiconductor lasers in which the concepts of particular embodiments of the present invention can be incorporated is taught in readily available technical literature relating to the design and fabrication of semiconductor lasers, the concepts of particular embodiments of the present invention may be conveniently illustrated with general reference to a three-section DBR-type semiconductor laser 10 illustrated schematically in FIG. 1. In FIG. 1, the DBR laser 10 is optically coupled to a light wavelength conversion device 20. The light beam emitted by the semiconductor laser 10 can be either directly coupled into the waveguide of the wavelength conversion device 20 or can be coupled through collimating and focusing optics or some other type of suitable optical element or optical system. The wavelength conversion device 20 converts the incident light into higher harmonic waves and outputs the converted signal. This type of configuration is particularly useful in generating shorter wavelength laser beams from longer wavelength semiconductor lasers and can be used, for example, as a visible laser source for laser projection systems.

The DBR laser 10 illustrated schematically in FIG. 1 comprises a wavelength selective section 12, a phase section 14, and a gain section 16. The wavelength selective section 12, which can also be referred to as the DBR section of the laser 10, typically comprises a first order or second order Bragg grating positioned outside the active region of the laser cavity. This section provides wavelength selection, as the grating acts as a mirror whose reflection coefficient depends on the wavelength. The gain section 16 of the DBR laser 10 provides the major optical gain of the laser and the phase section 14 creates an adjustable phase shift between the gain material of the gain section 16 and the reflective material of the wavelength selective section 12. The wavelength selective section 12 may be provided in a number of suitable alternative configurations that may or may not employ a Bragg grating.

Respective control electrodes 2, 4, 6, are incorporated in the wavelength selective section 12, the phase section 14, the gain section 16, or combinations thereof, and are merely illustrated schematically in FIG. 1. It is contemplated that the electrodes 2, 4, 6 may take a variety of forms. For example, the control electrodes 2, 4, 6 are illustrated in FIG. 1 as respective electrode pairs but it is contemplated that single electrode elements 2, 4, 6 in one or more of the sections 12, 14, 16 will also be suitable for practicing particular embodiments of the present invention. The control electrodes 2, 4, 6 can be used to inject electrical current into the corresponding sections 12, 14, 16 of the laser 10. The injected current can be used to alter the operating properties of the laser by, for example, controlling the temperature of one or more of the laser sections, injecting electrical current into a conductively doped semiconductor region defined in the laser substrate, controlling the index of refraction of the wavelength selective and phase sections 12, 14 of the laser 10, controlling optical gain in the gain section 16 of the laser, etc.

The wavelength conversion efficiency of the wavelength conversion device 20 illustrated in FIG. 1 is dependent on the wavelength matching between the semiconductor laser 10 and the wavelength conversion device 20. The output power of the higher harmonic light wave generated in the wavelength conversion device 20 drops drastically when the output wavelength of the laser 10 deviates from the wavelength conversion bandwidth of the wavelength conversion device 20. For example, when a semiconductor laser is modulated to produce data, the thermal load varies constantly. The resulting change in laser temperature and lasing wavelength generates a variation of the efficiency of the SHG crystal 20. In the case of a wavelength conversion device 20 in the form of a 12 mm-long PPLN SHG device, a temperature change in the semiconductor laser 10 of about 2° C. will typically be enough to take the output wavelength of the laser 10 outside of the 0.16 nm full width half maximum (FWHM) wavelength conversion bandwidth of the wavelength conversion device 20. Particular embodiments of the present invention address this problem by limiting laser wavelength variations to acceptable levels.

The present inventors have recognized challenges in stabilizing the emission wavelength of a semiconductor laser because they are commonly subject to wavelength drift and associated cavity mode hopping. For example, and not by way of limitation, FIG. 3 illustrates the evolution of emission wavelength as a function of gain current in a DBR laser. When the gain current increases, the temperature of the gain section also increases. As a consequence, the cavity modes move towards higher wavelengths. The wavelength of the cavity modes move faster than the wavelength of the DBR section. So, the laser reaches a point where a cavity mode of lower wavelength is closer to the maximum of the DBR reflectivity curve. At that point, the mode of lower wavelength has lower loss than the mode that is established and, according to basic principles of laser physics, the laser then automatically jumps to the mode that has lower loss. This behavior is illustrated on the curve 100 of FIG. 3. As is illustrated in FIG. 3, the wavelength slowly increases and includes sudden mode hops whose amplitude is equal to one free spectral range of the laser cavity.

Although the present invention is not limited to any particular manifestation of the wavelength variations and sudden mode hops, in the context of a laser projection system, these wavelength fluctuations can create smooth intensity variations and the mode hops can create relatively abrupt intensity shifts in the image created by scanning the laser. The particular pattern created in the image by these defects can be a function of a number of factors including, but not limited to, laser temperature, laser free spectral range, the PPLN crystal spectral band pass, the spectral alignment of the laser DBR with respect to the PPLN crystal, etc. Regardless of the nature of the defect pattern, the pattern itself can present a problem in the image because it presents a readily recognizable, systematic structure in the image. Also, for quasi static images, these defects typically repeat themselves from frame to frame, making it very easy to recognize the defects in the image.

As is described in detail below, with reference to FIGS. 9-17, image defects of this nature can be made harder to detect by applying different kinds of control signals to the phase and/or wavelength selective sections of the semiconductor laser. For example, and not by way of limitation, if the phase signal is kept constant for each frame that is generated but changed on a frame per frame basis, the consequence will be that each single frame will have a defect pattern, but the nature of the pattern, i.e., the position of the dark and bright areas in the pattern, will change from frame to frame. As a consequence, the eye will integrate in time all the images so that it will be hard to detect any systematic defect. As a further example, the present invention also contemplates changing the phase signal for each image line or pixel. As a consequence, the organized systematic image defect is transformed to more closely represent high frequency noise, which is much more difficult for the human eye to recognize.

It is also contemplated that the control signal applied to the laser can be completely random or presented in some more elaborate functions. As an example, the control signal can be injected into the phase and/or DBR section of the laser so that it corresponds to half the laser spectral range, effectively inverting the shape of the image defect. This inversion can be introduced on a frame-by-frame, line-by-line, or pixel-by-pixel basis, as is described above.

Referring further to FIG. 3, curve 101 illustrates significantly different emission behavior in a DBR laser. Specifically, a laser having the same general manufacturing parameters as the laser illustrated with reference to curve 100, may exhibit significantly different behavior in the sense that, instead of having mode hops with an amplitude of one laser free spectral range, the laser will exhibit mode hops having up to 6 or more free spectral range amplitudes. For many applications, this large sudden wavelength variation would not be acceptable. For example, in the case of a laser projection system, these large hops would cause sudden intensity jumps in the image from a nominal grey-scale value to a value close to zero. The present inventors have investigated this phenomena, as well as wavelength instability and hysteresis in lasers, and note that these laser emission defects can be attributed to one or more of a variety of factors, including spatial hole burning, spectral hole burning, gain profile broadening, and self induced Bragg gratings. It is contemplated that these factors may lock lasing on the particular cavity mode that has been established in the laser cavity or encourage larger mode hops. Indeed, it appears that once a mode is established, the photons that are inside the cavity at a specific wavelength disturb the laser itself by depleting the carrier density at a specific energy level or by creating a self induced Bragg grating in the cavity.

Figure 4:
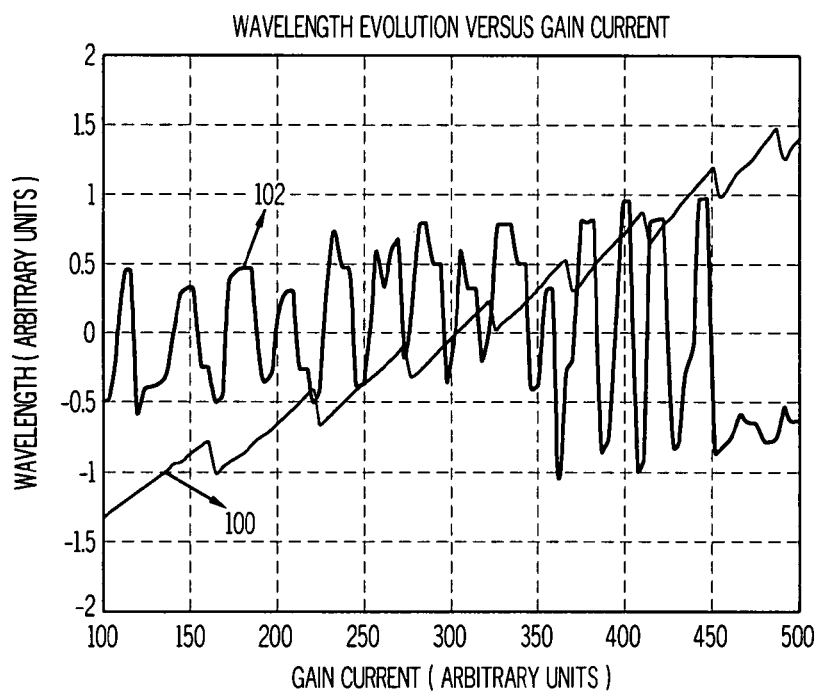

The curve 102 of FIG. 4 illustrates another case of special mode hopping behavior. In the illustrated case, the emission wavelength is unstable because it includes back reflections attributable to a component located outside the laser, a phenomena referred to as the external cavity effect. With the external cavity effect, an external reflection creates a parasitic Fabry-Perot cavity that disturbs the laser cavity and is capable of generating mode hops of very large amplitude. Regardless of the source of unacceptable wavelength drift in a semiconductor laser, particular embodiments of the present invention are directed at managing wavelength fluctuations of the laser.

The present inventors have recognized that the large wavelength fluctuations and associated mode-hopping effect illustrated in FIGS. 3 and 4 is at least partially dependent upon photon density in the laser cavity and can be amplified when having significant external cavity effects. The present inventors have also recognized that the lasing wavelength may jump more than one mode and that this multi-mode jump may be attributable, in whole or in part, to spectral and spatial hole burning and additional lasing phenomena such as external cavity effects.

Regardless of the cause of multi-mode drift in semiconductor lasers, when this phenomenon occurs, the lasing wavelength usually shows abnormal wavelength jumps which are equal to a multiple of the cavity mode spacing. Before a large mode hop occurs, the laser usually shows large continuous wavelength shift. The larger wavelength drift and the abnormal wavelength jump can cause unacceptable noise in a laser signal. For example, if this phenomenon happens systematically in a laser projection system, an example of which is illustrated schematically in FIG. 2, the noise in the projected image will be readily visible to the human eye.

Figure 5:
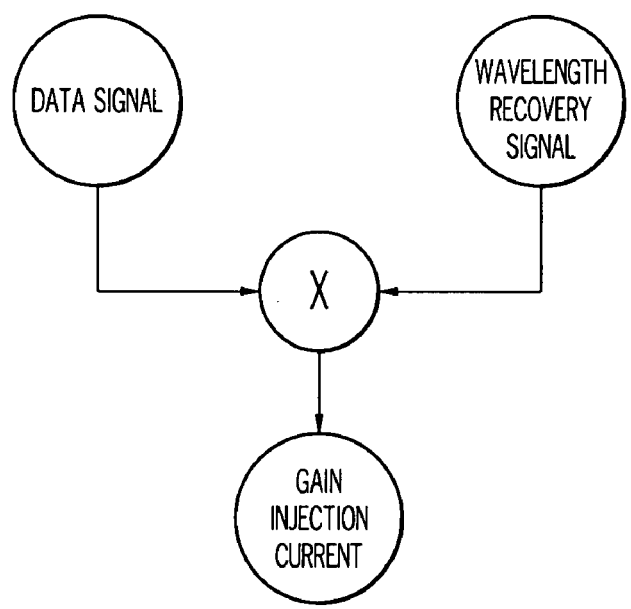
FIG. 5 illustrates a scheme for controlling laser wavelength according to one embodiment of the present invention.
Figure 6:
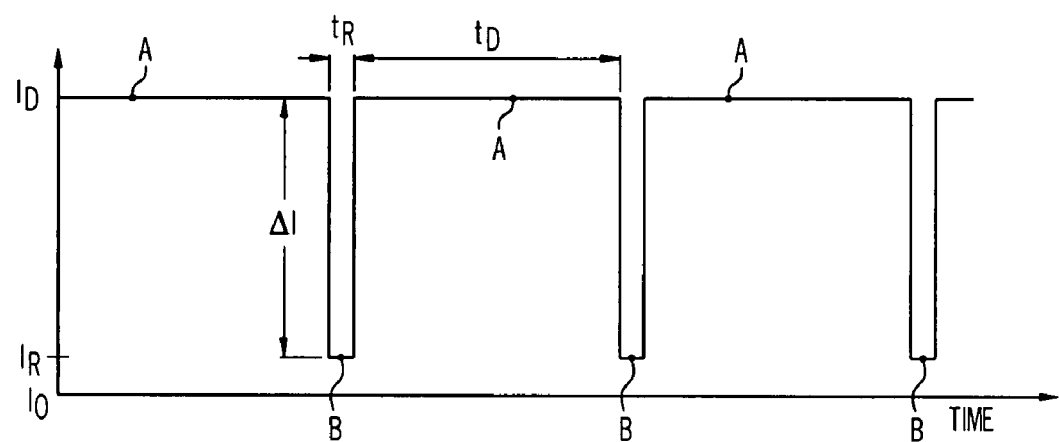
FIG. 6 is a further illustration of the control scheme illustrated in FIG. 5.

As is noted above, particular embodiments of the present invention generally relate to control schemes where a semiconductor laser drive current comprises a drive portion and a wavelength recovery portion. FIGS. 5 and 6 illustrate a scheme for controlling wavelength in a single mode laser signal where the drive portion comprises a data portion that is injected as electrical current into the gain section of the semiconductor laser. Accordingly, in the illustrated embodiment, the drive current comprises respective data portions A and wavelength recovery portions B. Referring specifically to FIG. 5, theses portions of the drive current or gain injection current can be introduced by taking the product of a laser data signal and a suitably configured wavelength recovery signal. For example, and not by way of limitation, the laser data signal may carry image data for projection in a laser projection system. As is illustrated in FIG. 6, the wavelength recovery signal is configured such that the data portion of the gain section drive current, i.e., the gain injection current, comprises a relatively high drive amplitude $I_D$ of relatively long drive duration $t_D$, while the wavelength recovery portion of the drive current comprises a relatively low recovery amplitude $I_R$ of relatively short recovery duration $t_R$. The relatively high drive amplitude $I_D$ of the data portion is sufficient for lasing within the laser cavity at a lasing mode $\lambda_0$. The relatively low recovery amplitude $I_R$ of the wavelength recovery portion of the drive current is distinct from the drive amplitude $I_D$ and is illustrated in FIG. 6 as being $\Delta I$ lower than the drive amplitude $I_D$.

The drive amplitude $I_D$ and duration $t_D$ of the data portion of the gain section drive current act to produce the optical signal with appropriate power and wavelength, depending of course on the specific application in which it is to be used. The recovery amplitude $I_R$ and the recovery duration $t_R$ are sufficient to decrease photon density within at least a portion of the laser cavity. By decreasing the photon density to a lower value, in many cases close to zero, the various phenomena that cause large wavelength drift, such as spectral hole burning, spatial hole burning, gain profile broadening, or self induced Bragg gratings, disappear. As a consequence, when significant current is re-injected into the gain section at the end of the recovery period, the laser automatically selects the modes that are among the closest to the maximum of the DBR reflectivity curve. Therefore, the wavelength fluctuations can be limited to one laser free spectral range and the multi-cavity mode hops are eliminated, or at least significantly reduced. The resulting gain section drive current, which comprises the data portion and the wavelength recovery portion can be used to minimize wavelength drift and narrow the time-average laser oscillation optical bandwidth of the laser.

Stated differently, the drive amplitude $I_D$ and duration $t_D$ of the data portion of the gain section drive current increase the probability that the lasing wavelength will undergo an unacceptable drift, for example, and not by way of limitation, a change in wavelength that exceeds 0.05 nm. The relatively low recovery amplitude $I_R$ of the density recovery portion of the gain section drive current follows the data portion of the drive current and decreases the probability of an unacceptable wavelength drift. If the recovery portion of the drive current has a sufficient high frequency of occurrence, a lasing cavity mode is shut off before it has accumulated large wavelength drift and a new cavity mode is selected, therefore reducing the large wavelength drift.

In the context of a laser projection system including, for example, a frequency doubled PPLN green laser, without wavelength control according to embodiments of the present invention, the green power emitted by the laser over a single line of the image display will exhibit sudden variations in power due to multiple cavity mode hops. As a result, projected images will have abrupt drops in power with amplitude on the order of 50% and more. However, employing wavelength control schemes according to particular embodiments of the present invention where the drive signal is altered for every pixel, e.g., typically every 40 ns, it is contemplated that the undesired decrease in laser power will be highly mitigated. For example, in one execution of an embodiment of the present invention, residual noise standard deviation in the image was on the order of 8% with the recovery amplitude $I_R$ set to near zero, the recovery duration $t_R$ at about 10 nsec, and the drive duration $t_D$ at about 40 nsec. The image was also observed to have defects with relatively high spatial frequency, which are typically not readily apparent to the naked eye.

Although the recovery amplitude $I_R$ may be zero, it can be any value that is sufficient to eliminate the source of multiple cavity mode hops or otherwise improve the wavelength behavior of the laser. The recovery amplitude $I_R$ of the gain section drive current will be lower than the drive amplitude $I_D$ and can be substantially above zero. The relatively high drive amplitude $I_D$ may be substantially continuous but will often vary in intensity, particularly where the semiconductor laser is incorporated in an image projection system, as is described in further detail below.

Where the laser is configured for optical emission of encoded data, a data signal representing the encoded data is applied to the laser. For example, and not by way of limitation, the data signal may incorporated as an intensity or pulse-width modulated data portion of a drive signal injected into the gain section of the laser. The wavelength recovery operation of particular embodiments of the present invention is executed to be at least partially independent of the data encoded in the data signal. For example, where the drive current is injected into the gain section of the laser, its drive portion may be intensity modulated to encode data. The wavelength recovery portion of the drive current is superimposed on the drive current, independent of the encoded data. Similarly, where the drive portion is pulse-width modulated to encode data, the wavelength recovery portion of the drive current will also be superimposed on the drive current.

The aforementioned superposition may be completely independent of the encoded data or may be applied only where the intensity of the drive current or the duration of the pulse width representing the encoded data reaches a threshold value, in which case it would be partially dependent on the encoded data. Once superimposed, however, the extent of independence of the wavelength recovery portion would need to be sufficient to ensure that sufficient wavelength recovery would be obtained. Stated differently, the wavelength recovery portion of the drive current should dominate the drive current under conditions where the data signal would otherwise prevent wavelength recovery. For example, in the context of a pulse-width modulated data signal, it is contemplated that wavelength recovery may not be needed for relatively short, high amplitude pulse-widths. However, where the encoded data includes relatively long, high amplitude pulse widths, the duty cycle defined by the drive operation and wavelength recovery operation should be sufficient to limit the maximum duration of the high amplitude pulse width to ensure that wavelength recovery can be achieved before unacceptable wavelength drift is observed. For example, it may be preferable to ensure that the maximum duration of the pulse width cannot exceed about 90% of the duration of the duty cycle defined by the drive operation and wavelength recovery operation. In addition, in the context of pulse-width modulated data, care should also be taken to ensure that the recovery amplitude $I_R$ of the wavelength recovery portion is below the threshold lasing current of the semiconductor laser or sufficiently low to recover the wavelength.

It is also noted that the wavelength recovery signal does not need to be implemented on a regular, periodic basis. Rather, the recovery signal can be applied as-needed. For example, if a wavelength drift exceeding an acceptable value is detected, e.g., more than one cavity mode spacing, a wavelength recovery operation can be implemented by superimposing a wavelength recovery signal on the drive current, forcing the laser to choose a new wavelength.

In terms of frequency of the recovery period, it generally needs to, be frequent enough to limit the wavelength variation between two recovery periods to an acceptable amplitude. The ideal frequency and approach depends on the particular demands associated with the application in which the laser is utilized. As an example, for laser projection, it may be preferable to initiate recovery periods randomly or synchronize recovery periods with the image pixel generation to avoid any aliasing problem between the data content, i.e., the image, and the recovery signal. Also, by performing recovery at the highest possible frequency compatible with the electronics and laser speed any noise in the image will occur at a higher spatial frequency, making the noise harder to detect.

Figure 7:
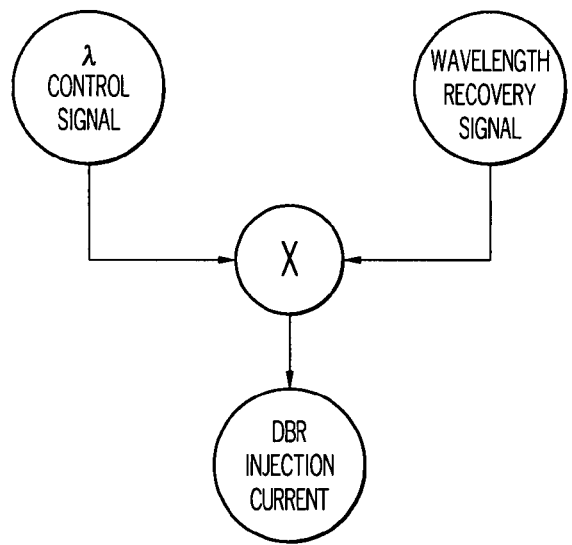
FIG. 7 illustrates a scheme for controlling laser wavelength according to another embodiment of the present invention.
Figure 8:
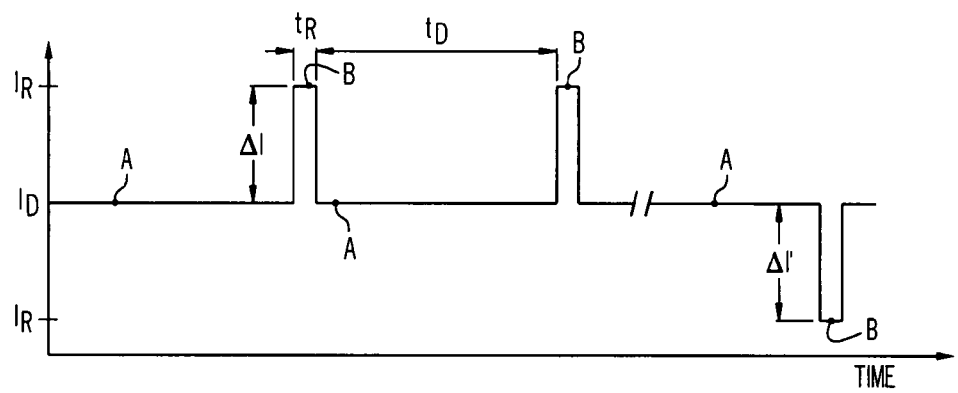
FIG. 8 is a further illustration of the control scheme of FIG. 7.

FIGS. 7 and 8 illustrate a scheme for controlling wavelength in a single mode laser signal where the aforementioned drive portion of the semiconductor laser drive current comprises a wavelength control signal injected into the wavelength selective section of the semiconductor laser. Accordingly, the drive current injected into the wavelength selective section of the semiconductor laser comprises the wavelength control portion and a wavelength recovery portion. As is noted above, this drive current is also referred to herein as the DBR injection current because the wavelength selective section of a DBR laser is commonly referred to as the DBR section of the laser.

Referring specifically to FIG. 7, the wavelength control portion and the wavelength recovery portion of the DBR injection current can be introduced by taking the product of a standard DBR wavelength control signal and a suitably configured wavelength recovery signal according to particular embodiments of the present invention. As is illustrated in FIG. 8, the wavelength recovery signal is configured such that the wavelength control portion of the DBR injection current comprises a drive amplitude $I_D$ of relatively long drive duration $t_D$, while the wavelength recovery portion of the drive current comprises a recovery amplitude $I_R$ of relatively short recovery duration $t_R$. The recovery amplitude $I_R$ of the wavelength recovery portion of the DBR injection current is distinct from the drive amplitude $I_D$, may be lower or higher than the drive amplitude $I_D$, and is illustrated in FIG. 8 as differing from drive amplitude $I_D$ by $\Delta I$ or $\Delta I'$.

The amplitude $I_D$ of the wavelength control portion is sufficient to keep the DBR wavelength tuned to the adequate wavelength which, in the case of a frequency doubled PPLN laser is fixed by the wavelength of the doubling crystal. When the DBR current is changed to the recovery amplitude $I_R$, which is sufficiently different from the drive amplitude $I_D$, the Bragg wavelength is shifted to a different wavelength and a new cavity mode begins to lase. The original lasing cavity mode is turned off. If the new cavity mode is sufficiently displaced from the original lasing cavity mode, the phenomena that are responsible for multiple cavity mode hops will disappear, or substantially dissipate, at the laser nominal targeted wavelength. At the end of the DBR recovery pulse, the DBR current is returned to its original level, shifting the Bragg wavelength back to its original position. At this time, the new cavity mode is turned off and lasing resumes at a recovered mode at or near the original Bragg wavelength, under the recovered optical gain spectrum. It is contemplated that the resulting image will have attributes similar to those discussed above with respect to the control scheme of FIGS. 5 and 6.

One contemplated explanation of the theoretical basis for the embodiment of the present invention illustrated in FIGS. 7 and 8 is that the scheme essentially changes the photon standing wave at the gain-compressed wavelength to another wavelength outside the spectral hole burning region. The duration of the change in the standing wave is relatively brief, typically only long enough to remove the spectral hole burning and recover the original gain spectrum. It is contemplated that the wavelength shift induced under the recovery amplitude $I_R$ may vary in magnitude but will often preferably be equivalent to a wavelength shift of at least about two lasing modes. Indeed, it is contemplated that the wavelength shift may be so large as to disable lasing with the laser cavity. It is also contemplated that the control scheme of FIGS. 7 and 8 can be applied to external cavity semiconductor lasers by changing the external feedback to temporarily move the lasing wavelength out of the original position in order for the carriers to fill the spectral hole.

Referring to the laser projection system illustrated schematically in FIG. 2, it is noted that the drive current control schemes according to particular embodiments of the present invention may be executed in a variety of forms within the system. For example, and not by way of limitation, the wavelength recovery portion of the drive current may be executed by integrating the recovery portion into the video signal during rendering by the projection software and electronics. In this approach pixels distributed throughout the image would be altered by the wavelength recovery signal independent of the required intensity from the source image. The frequency of this interruption should be chosen to minimize the impact on the human eye, and on perceived optical power. Alternatively, the wavelength recovery portion of the drive signal may be integrated into the laser driver electronics. In this approach, the drive signal, which is derived from the image stream, would be periodically overridden by the wavelength recovery signal prior to current scaling. Again, the frequency and duty cycle of this interruption should be chosen to minimize the impact on the human eye, and on perceived optical power. As a further alternative, the drive current to the laser could be periodically shunted, or otherwise reduced, to reduce or modify the drive current independent of the desired intensity level.

It is contemplated that FIGS. 5-8 illustrate laser operation schemes that may be used alternatively or together to reduce noise in a single mode laser signal. Further, the schemes of FIGS. 5-8 may be used in systems incorporating one or more single mode lasers. For example, as is described in further detail below, it is contemplated that the schemes of FIGS. 5-8 may be used alternatively or together in scanning laser image projection systems incorporating one or more single mode lasers. It is also noted that reference herein to single mode lasers or lasers configured for single mode optical emission should not be taken to restrict the scope of the present invention to lasers that operate in a single mode exclusively. Rather, the references herein to single mode lasers or lasers configured for single mode optical emission should merely be taken to imply that lasers contemplated according to particular embodiments of the present invention will be characterized by an output spectrum where a single mode of broad or narrow bandwidth is discernable therein or by an output spectrum that is amenable to discrimination of a single mode there from through suitable filtering or other means.

It is contemplated that the relative magnitudes of the drive duration $t_D$ and the recovery duration $t_R$ should be controlled to preserve an optimal degree of laser efficiency while ensuring adequate wavelength recovery. For example, according to one aspect of the present invention, at least about 80% of a duty cycle of the drive signal is occupied by the drive duration $t_D$ and less than about 20% of a duty cycle of the drive signal is occupied by the recovery duration $t_R$. In many instances, it will be sufficient to ensure that the recovery duration $t_R$ is less than about 10 ns, perhaps shorter than about 5 ns. Additionally control schemes are contemplated where at least about 95% of the duty cycle of the drive signal is occupied by the drive duration $t_D$ and less than about 5% of the duty cycle is occupied by the recovery duration $t_R$. In cases where the electric circuitry controlling the drive signal is sufficiently responsive, adequate control schemes are contemplated where at least about 97.5% of the duty cycle of the drive signal is occupied by the drive duration $t_D$ and less than about 2.5% of the duty cycle is occupied by the recovery duration $t_R$.

Additional considerations need to be accounted for when establishing the respective values of the drive duration $t_D$ the recovery duration $t_R$ in the context of laser projection systems. For example, and not by way of limitation, the laser projection system illustrated in FIG. 2 comprises an image source generating a single or multi-color image data stream, image projection software and associated electronics for generating a laser drive signal for each primary image color, a laser driver generating respective laser drive currents for individual lasers configured to generate each primary image color, and scanning and projection optics that operate to generate a single or multi-color projected image comprising an array of image pixels. Each of the image pixels in this and other types of scanning laser image projecting systems is characterized by an active pixel duration $t_p$. For example, and not by way of limitation, the active pixel duration of a pixel in the image may be 40 nsec or less. Generally, the recovery duration $t_R$ will be less than the pixel duration $t_p$. Preferably, the recovery duration $t_R$ is at least 50% less than the pixel duration $t_p$. In contrast, the drive duration $t_D$ may be greater than, less than, or equal to the pixel duration $t_p$, depending upon the preferences of the system designer.

Those skilled in the art will recognize that the active pixel duration $t_p$ may vary modestly and periodically across the image as a result of scanning speed variations. Accordingly, reference to a projecting system that is "characterized by an active pixel duration" should not be taken to denote that each pixel in an image has the same pixel duration. Rather, it is contemplated that individual pixels within the display may have different pixel durations that each fall under the general concept of a display characterized by an active pixel duration $t_p$.

A multi-tone image can be generated by the image projection system by configuring the image projection electronics and the corresponding laser drive currents to establish a pixel intensity that varies across the array of image pixels. In this case, the wavelength recovery portion of the drive current is superimposed upon the signal that encodes the varying pixel intensity. Further detail concerning the configuration of scanning laser image projection systems and the manner in which varying pixel intensities are generated across an image is beyond the scope of the present invention and may be gleaned from a variety of readily available teachings on the subject.

The present inventors have recognized that semiconductor lasers commonly exhibit a temperature evolution signature that can create unfavorable patterning in the output of the laser and the output of a wavelength conversion device coupled to the laser. This unfavorable patterning can create significant problems in the context of the laser projection systems described above. Accordingly, the present invention also contemplates perturbation schemes for disrupting the temperature evolution signature of a semiconductor laser or otherwise controlling lasing wavelength of a semiconductor laser.

Figure 9:
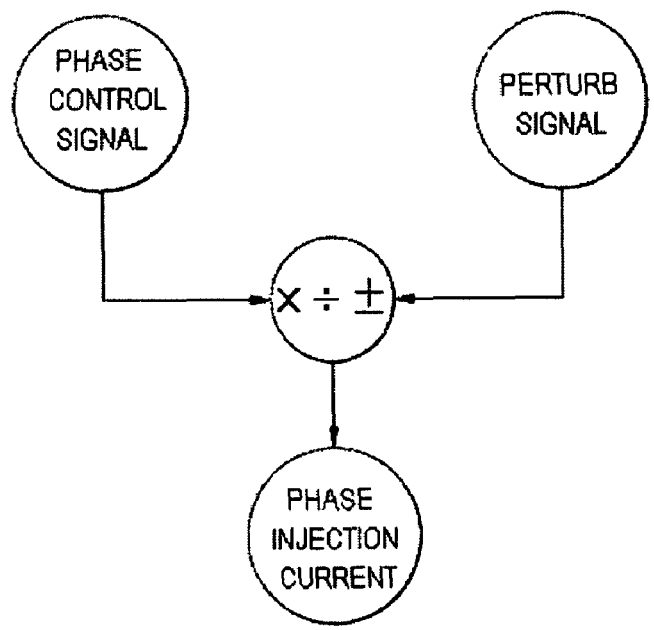
FIG. 9 illustrates a scheme for disrupting the unfavorable temperature evolution signature of a semiconductor laser.
Figure 10:
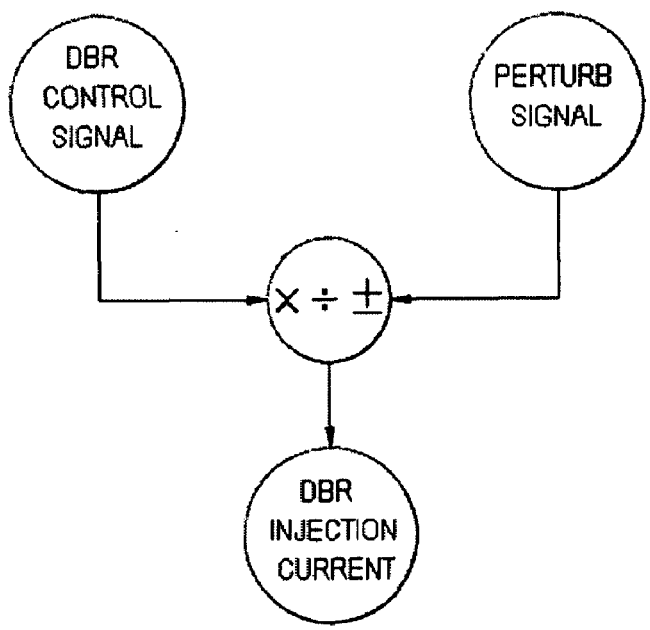
FIG. 10 illustrates an alternative scheme for disrupting the unfavorable temperature evolution signature of a semiconductor laser.

FIGS. 9 and 10 illustrate two examples of suitable perturbation schemes according to the present invention. Referring initially to FIGS. 1 and 9, it is noted that a first perturbation scheme of the present invention utilizes a perturbation signal $I/V_{PTRB}$ to modify the drive signal $I/V_{PHASE}$ that is used to control the phase section 14 of a semiconductor laser 10 comprising, for example, a wavelength selective section 12, a phase section 14, and a gain section 16. The perturbation signal $I/V_{PTRB}$ and the drive signal $I/V_{PHASE}$ can be voltage or current-based control signals, depending on the structure of the semiconductor laser, and can be applied to the phase section 14 of a semiconductor laser 10 with the use of microheaters in thermal communication with the phase section 14, via direct electrical current injection into the phase section 14, or by applying a suitable voltage to the phase section 14.

Generally, the perturbation signal $I/V_{PTRB}$ is selected to disrupt systematic wavelength variations in the optical emission of the semiconductor laser. More specifically, the perturbation signal $I/V_{PTRB}$ disrupts the systematic wavelength variations by introducing an amplitude profile that varies significantly enough over time to alter mode selection in the semiconductor laser 10. As a result, a plurality of different emission modes are selected in the semiconductor laser 10 over a target emission period to disrupt organized bias generated in the laser emission. In the context of a laser projection system, the target emission period may correspond to a single pixel, a set of pixels, or one or more given encoded data periods (for non-pixel based projection systems, such as the afore-mentioned spatial light modulator based systems).

Similarly, referring to FIG. 10, it is contemplated that a perturbation signal $I/V_{PTRB}$ can be used to alter mode selection in a semiconductor laser by modifying the drive signal $I/V_{DBR}$ that is used to control the wavelength selective section 12 of the semiconductor laser. In addition, it is contemplated that a perturbation signal $I/V_{PTRB}$ can be used to modify both the drive signal $I/V_{PHASE}$ of the phase section 14 and the drive signal $I/V_{DBR}$ of the wavelength selective section 12 to alter mode selection in the semiconductor laser. In either case, as is noted above with respect to the phase section 14 of the semiconductor laser 10, the perturbation signal $I/V_{PTRB}$ can be a voltage or current-based control signal and can be applied to alter mode selection in the semiconductor laser 10 with the use of microheaters in thermal communication with the wavelength selective section 12 and/or the phase section 14, through direct current injection into the wavelength selective section 12 and/or the phase section 14, or by applying a suitable voltage to the wavelength selective section 12 and/or the phase section 14.

In the illustrated embodiments, the perturbation is executed using multiplication, division, summation, or combinations thereof, but it is contemplated that any suitable algorithm or modification process may be used in conjunction with the perturbation signal $I/V_{PTRB}$. It is also noted that, perturbing the drive signal $I/V_{DBR}$ of the wavelength selective section 12 alone may, in some instances, result in images that contain excessive noise, as compared to the case where the perturbation signal $I/V_{PTRB}$ is used to modify the drive signal $I/V_{PHASE}$ of the phase section 14.

When using the RZ modulation techniques described herein, in many instances the laser cavity mode gets selected every time the laser is reset and the laser wavelength keeps changing without mode hopping between two resetting operations. Accordingly, although the phase perturbation methods described above are typically executed on a frame-per-frame, line-per-line, or pixel-per-pixel basis, it is contemplated that it may also be advantageous to synchronize the phase perturbation signal with the laser resetting operations. It is contemplated that phase perturbation can be turned off at the end of a line, at the end of a frame, or both, to conserve power. In addition, or alternatively, perturbation can be turned off during the laser resetting operations described herein. These design considerations can have important implications on the efficiency of the light source.

FIGS. 11-17 present a variety of means by which the schemes of FIGS. 9 and 10 can be achieved. Although FIGS. 11-17 illustrate perturbation schemes according to the present invention in contexts where wavelength recovery operations similar to those described above in FIGS. 5-8 are employed, it is contemplated that the various perturbation schemes of the present invention may be employed in conjunction with or independent of the wavelength recovery operations illustrated in FIGS. 5-8.

Referring to FIGS. 11-17, the perturbation schemes of the present invention are illustrated in the context of the control schemes described above with reference to FIGS. 5-8, where the semiconductor laser drive current comprises a plurality of data portions A and corresponding wavelength recovery portions B interposed temporally between the corresponding data portions A. The amplitude profile of the perturbation signal $I/V_{PTRB}$ comprises a plurality of distinct, temporally spaced perturbation signal amplitudes C. Each of the distinct, temporally spaced perturbation signal amplitudes C are timed to correspond temporally with transitions in the encoded data from one of the wavelength recovery portions B to a corresponding data portion A. As a result, different lasing modes will be selected for each different perturbation signal amplitude C as the gain current $I_{GAIN}$ transitions from the non-lasing, recovery amplitude at B to the lasing data portion at A. This effective randomization of the mode selection helps to disrupt the systematic wavelength variations that would otherwise be present in the optical emission of the semiconductor laser.

Figure 11:
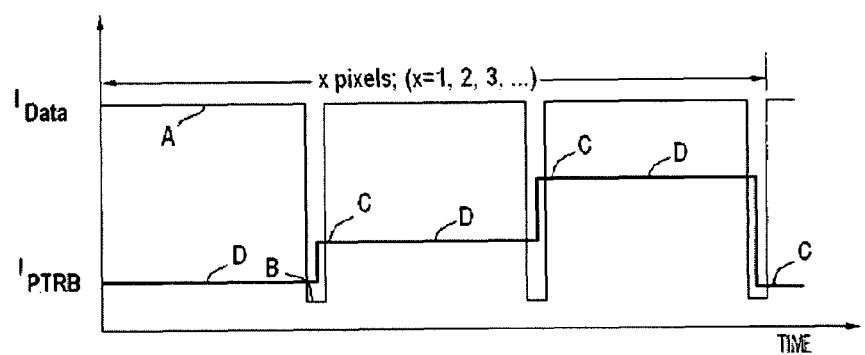
FIGS. 11-17 illustrate some of the many suitable perturbation signal profiles for use in the schemes illustrated in FIGS. 9 and 10.

In the embodiment of FIG. 11, each different perturbation signal amplitude C is followed by a relatively static portions D where the perturbation signal amplitude C remains constant until the next perturbation signal amplitude C is selected. As is noted above, by choosing a random value for the perturbation signal amplitude C, the cavity mode is randomly selected and the systematic organized image defects described above are eliminated.

Figure 12:
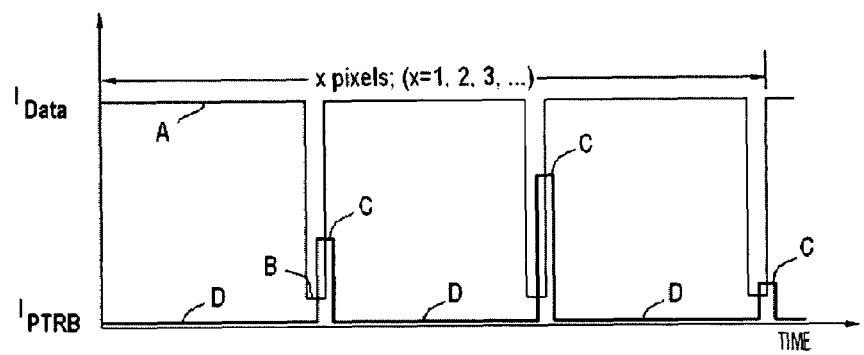

In the embodiment of FIG. 12, the static portions D interposed between the distinct, temporally spaced perturbation signal amplitudes C are rest to zero once the laser resetting operation is finished. The static portions D of the perturbation signal $I/V_{PTRB}$ do not contribute to altered mode selection in the semiconductor laser. Although the approach of FIG. 12 presents some advantages in terms of power consumption over the approach illustrated in FIG. 11, in some cases it can be less efficient in eliminating image defects and may introduce more noise than the approach of FIG. 11. To reduce power consumption, the distinct, temporally spaced perturbation signal amplitudes C of the amplitude profile are maintained for a substantially shorter duration than the static portions D of the amplitude profile but they are held for a time period that is long enough to ensure that different lasing modes are selected for each different perturbation signal amplitude C on a consistent basis. For example, to preserve operating efficiency it may be preferable to limit the duration of the perturbation signal amplitudes C to less than about 5% of the duty cycle of the perturbation signal $I/V_{PTRB}$.

Figure 13:
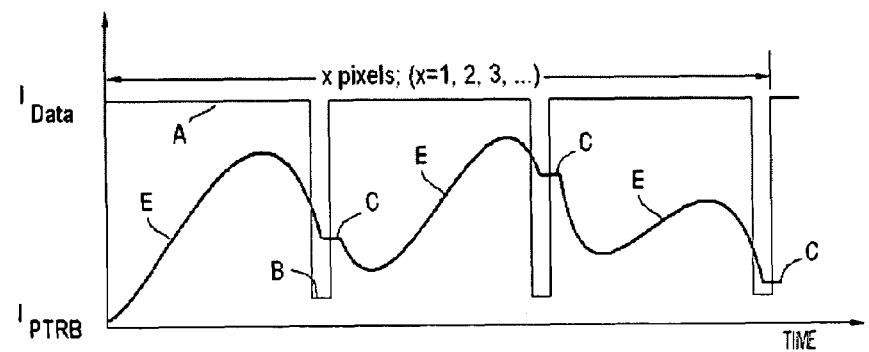

Although the embodiment of FIGS. 11 and 12 utilize the static portions D, the present inventors have recognized that the static portions D may be replaced with amplitude-modulated portions to achieve additional disruption of the otherwise systematic wavelength variations in the semiconductor laser, as is illustrated in FIG. 13. The perturbation signal $I/V_{PTRB}$ illustrated in FIG. 13 comprises respective amplitude-modulated portions E interposed between the distinct, temporally spaced perturbation signal amplitudes C. The variation of the amplitude-modulated portions E is sufficient to move a mode in a wavelength and enforce mode hops in the semiconductor laser between the perturbation signal amplitudes C. In this manner, a plurality of different emission modes are selected in the semiconductor laser as the laser is driven to generate the data portion of the emitted signal. The result is a broadening of the effective bandwidth of the optical spectrum of a laser. The operation serves to further disguise the patterned variations in the intensity profile of the laser.

Figure 14:
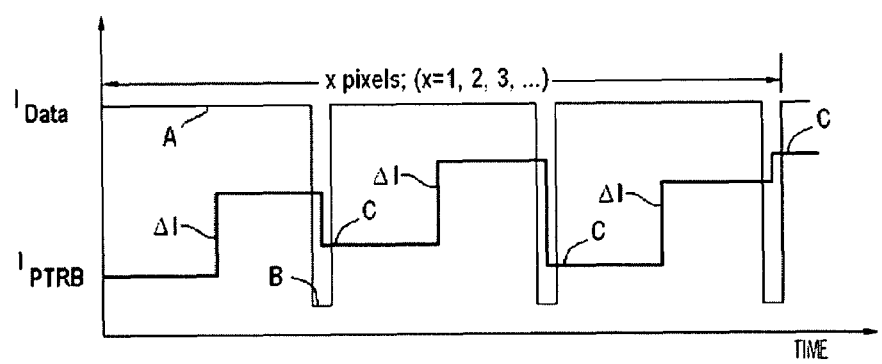

In some applications, the control scheme of FIG. 13 may introduce excessive noise in a scanned laser image because of the random nature of the respective amplitude-modulated portions E. More specifically, the image noise may be excessive because the magnitude of the spectral broadening may vary from pixel to pixel from relatively large to relatively small values. FIG. 14 presents an alternative scheme where the magnitude of the perturbation signal $I/V_{PTRB}$ is systematically changed by a constant amount $\Delta I$ between two laser resetting operations where the respective perturbation signal amplitudes C are introduced. The method of FIG. 14 is equivalent to generating two separate laser modes of equal separation for each image pixel. The separation of the two laser modes is a function of the value of $\Delta I$.

Figure 15:
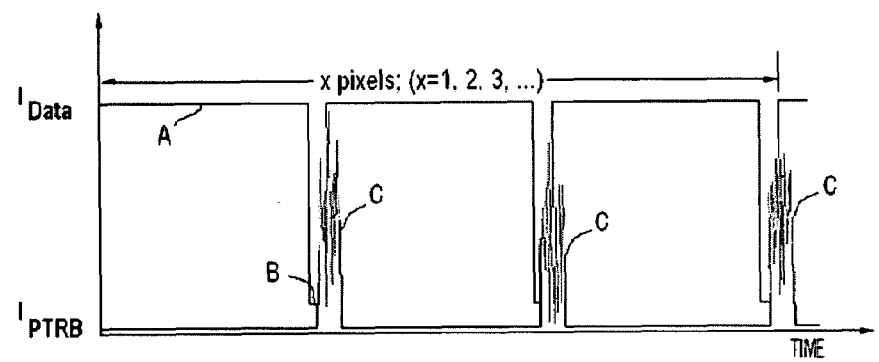
Figure 16:
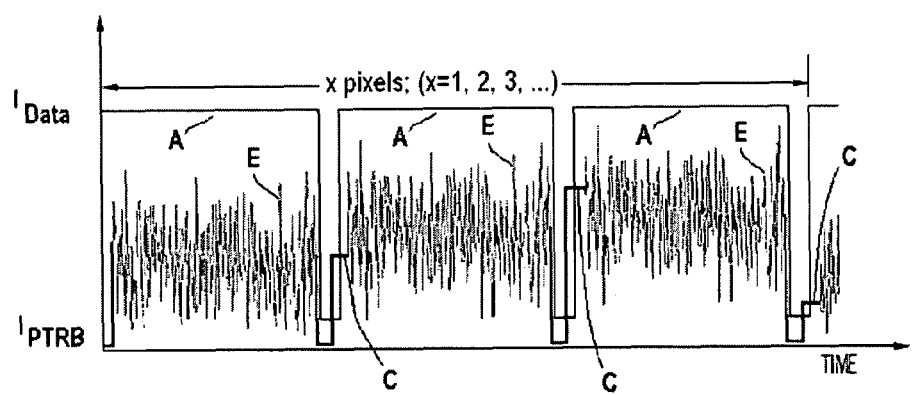
Figure 17:
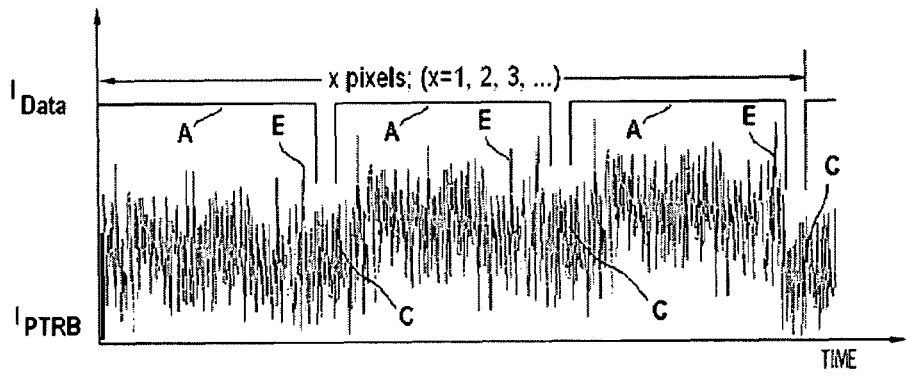

The perturbation signals $I_{PTRB}$ illustrated in FIGS. 15-17 demonstrate the use of noise in the perturbation schemes according to the present invention. For example, referring to FIG. 15, it is contemplated that the plurality of distinct, temporally spaced perturbation signal amplitudes C can be presented as noise in the perturbation signal $I/V_{PTRB}$ because the random nature of the amplitude of the noise signal can be used to disrupt patterned mode selection in the laser. Similarly, referring to FIG. 16, the amplitude-modulated portions E can also be presented as noise in the perturbation signal $I/V_{PTRB}$. Finally, referring to FIG. 17, it is contemplated that the plurality of distinct, temporally spaced perturbation signal amplitudes C and the respective modulated portions E interposed between the distinct, temporally spaced perturbation signal amplitudes C can both be presented as a single, continuous noise component of the perturbation signal $I/V_{PTRB}$. In any event, the noise signal selected for use in the context of the present invention should be configured to define amplitude variations in the perturbation signal $I/V_{PTRB}$ that are significant enough to alter mode selection in the laser and move the lasing mode in wavelength.

As is noted above, it is contemplated that the various perturbation schemes of the present invention may be employed independent of the wavelength recovery operations illustrated in FIGS. 5-8. In this context, perturbation signals $I_{PTRB}$ according to the present invention will merely comprises a plurality of amplitude-modulated portions that vary to an extent sufficient to alter mode selection such that a plurality of different emission modes are selected in the semiconductor over a given period. Perturbation signals of this nature may be conveniently put into force by using a noise signal or any of the aforementioned signals as the perturbation signal $I/V_{PTRB}$. In addition, the perturbation signal can incorporate sinusoidal, triangular, or other types of periodic waves. For example, a sinusoidal wave current injected into the phase section of a DBR laser could oscillate the wavelength of a lasing cavity mode at frequency higher than the pixel rate of an image.

In the context of pixel-based laser projection systems, where a scanned laser image is generated by scanning an output beam of a visible light source across an image comprising an array of image pixels, a perturbation signal $I/V_{PTRB}$ according to the present invention can be configured such that one or more different emission modes is selected over a given active pixel duration $t_p$. In this manner, the projection system can be operated to ensure perturbation is executed in each active pixel of the image, or at least in a majority of the image pixels. In particular applications, it may be preferable to configure the perturbation signal $I/V_{PTRB}$ such that a plurality of different emission modes is selected for each active pixel, or for at least a majority of the active pixels. Similarly, in the context of other, non-pixel based projection systems, such as spatial light modulator based systems, it is contemplated that the perturbation signal $I/V_{PTRB}$ can be configured such that one or more different emission modes is selected in each of the encoded data periods $t_p$ of the encoded laser signal.

Although the present invention has been described with primary reference to pixel-based projection systems, it is contemplated that other projection systems, such as spatial light modulator based systems (including digital light processing (DLP), transmissive LCD, and liquid crystal on silicon (LCOS)), incorporating laser-based light sources may benefit from the wavelength stabilization and perturbation techniques described herein. In these other systems the relevant period exogenous to the laser is not the pixel period but the inverse of the screen refresh rate, or a fraction thereof. In these cases the input signal to the laser will be characterized by an encoded data period $t_p$ and the drive current will be configured such that the recovery duration $t_R$ of the wavelength recovery portion is less than the encoded data period $t_p$.

Reference is made throughout the present application to various types of currents. For the purposes of describing and defining the present invention, it is noted that such currents refer to electrical currents. Further, for the purposes of defining and describing the present invention, it is noted that reference herein to "control" of an electrical current does not necessarily imply that the current is actively controlled or controlled as a function of any reference value. Rather, it is contemplated that an electrical current could be controlled by merely establishing the magnitude of the current.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For example, although the control schemes described herein relate to the incorporation of a wavelength recovery portion in a drive current applied to a gain section or wavelength selective DBR section of a semiconductor laser, it is contemplated that methods of incorporating the wavelength recovery operation in a laser operating scheme are not limited to drive currents applied to only these portions of a laser. For example, and not by way of limitation, the laser may include a recovery portion that is configured to absorb photons when a recovery signal is applied thereto. In which case, the recovery portion can be used to decrease photon density as needed, in a manner similar that which is employed for the gain and DBR sections described herein.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A method of controlling a laser projection system comprising a visible light source, wherein the visible light source comprises a semiconductor laser and the method comprises:
    generating at least a portion of a scanned laser image by configuring the semiconductor laser for optical emission of encoded image data and scanning an output beam of the visible light source across a plurality of image pixels or encoded data periods, at least one parameter of the optical emission being a function of a drive current $I_{GAIN}$ injected into a gain section of the semiconductor laser and one or more additional drive currents $I/V_{PHASE}$, $I/V_{DBR}$, the additional drive signal $I/V_{PHASE}$ being applied to a phase section of the semiconductor laser and the additional drive signal $I/V_{DBR}$ being applied to a wavelength selective section of the semiconductor laser;
    altering mode selection in the semiconductor laser as the output beam is scanned across the image pixels or encoded data periods by perturbing at least one of the additional drive currents $I/V_{PHASE}$, $I/V_{DBR}$ with a perturbation signal $I/V_{PTRB}$, the perturbation signal $I/V_{PTRB}$ comprising an amplitude profile that varies significantly enough over time to alter mode selection in the semiconductor laser such that a plurality of different emission modes are selected in the semiconductor laser as the output beam is scanned across the image pixels or encoded data periods.

2. A method as claimed in claim 1 wherein:
    the laser is controlled such that the optical emission of encoded data comprises a plurality of data portions and corresponding wavelength recovery portions interposed temporally between corresponding data portions;
    the data portions comprise respective drive amplitudes $I_D$ and drive durations $t_D$;
    the wavelength recovery portions comprise recovery amplitudes $I_R$ distinct from the drive amplitudes $I_D$ of the data portions and recovery durations $t_R$ less than the drive durations $t_D$ of the data portions;
    the amplitude profile of the perturbation signal $I/V_{PTRB}$ comprises a plurality of distinct, temporally spaced perturbation signal amplitudes; and
    respective ones of the plurality of distinct, temporally spaced perturbation signal amplitudes are timed to correspond temporally with transitions in the encoded data from one of the wavelength recovery portions to a corresponding data portion.

3. A method as claimed in claim 2 wherein the amplitude profile of the perturbation signal $I/V_{PTRB}$ further comprises relatively static portions interposed between the distinct, temporally spaced perturbation signal amplitudes.

4. A method as claimed in claim 3 wherein:
    the amplitude of the relatively static portion is substantially equal to the perturbation signal amplitude preceding the static portion; and
    the relatively static portion is maintained until initiation of a corresponding wavelength recovery portion.

5. A method as claimed in claim 3 wherein:
    the amplitude of the relatively static portion is closer to zero than the perturbation signal amplitude preceding the static portion; and the relatively static portion is maintained until initiation of a corresponding wavelength recovery portion.

6. A method as claimed in claim 2 wherein:
the amplitude profile of the perturbation signal $I/V_{PTRB}$ further comprises respective amplitude-modulated portions interposed between the distinct, temporally spaced perturbation signal amplitudes; and
the amplitude-modulated portions of the amplitude profile vary to an extent sufficient to move the wavelength of a lasing cavity mode to enforce mode hops in the semiconductor laser such that a plurality of different emission modes are selected in the semiconductor laser over at least a portion of the drive duration $t_D$ of the data portion.

7. A method as claimed in claim 6 wherein the amplitude-modulated portions of the amplitude profile are presented as noise in the perturbation signal $I/V_{PTRB}$.

8. A method as claimed in claim 2 wherein the plurality of distinct, temporally spaced perturbation signal amplitudes are presented as noise in the perturbation signal $I/V_{PTRB}$.

9. A method as claimed in claim 2 wherein:
the amplitude profile of the perturbation signal $I/V_{PTRB}$ further comprises respective amplitude-modulated portions interposed between the distinct, temporally spaced perturbation signal amplitudes;
the plurality of distinct, temporally spaced perturbation signal amplitudes and the respective modulated portions interposed between the distinct, temporally spaced perturbation signal amplitudes are presented as noise in the perturbation signal $I/V_{PTRB}$; and
the amplitude of the noise in the perturbation signal $I/V_{PTRB}$ varies to an extent sufficient to alter mode selection in the semiconductor laser such that a plurality of different emission modes are selected in the semiconductor laser over at least a portion of the drive duration $t_D$ of the data portion and at transitions in the encoded data from one of the wavelength recovery portions to a corresponding data portion.

10. A method as claimed in claim 1 wherein the amplitude profile of the perturbation signal $I/V_{PTRB}$ comprises a plurality of amplitude-modulated portions that vary to an extent sufficient to move the wavelength of a lasing cavity mode to enforce mode hops in the semiconductor laser such that a plurality of different emission modes are selected in the semiconductor laser over at least a portion of a target emission period.

11. A method as claimed in claim 10 wherein the amplitude-modulated portions are presented as noise in the perturbation signal $I/V_{PTRB}$.

12. A method as claimed in claim 10 wherein the amplitude-modulated portions are presented as a periodic signal in the perturbation signal $I/V_{PTRB}$.

13. A method as claimed in claim 10 wherein the periodic signal includes a sinusoidal portion.

14. A method as claimed in claim 1 wherein the perturbation is executed by modifying the additional drive current $I/V_{PHASE}$, $I/V_{DBR}$ with the perturbation signal $I/V_{PTRB}$ using multiplication, division, summation, or combinations thereof.

15. A method as claimed in claim 1 wherein the mode selection in the semiconductor laser is altered by perturbing the additional drive signal $I/V_{PHASE}$ with the perturbation signal $I/V_{PTRB}$.

16. A method as claimed in claim 1 wherein the mode selection in the semiconductor laser is altered by perturbing the additional drive signal $I/V_{DBR}$ with a perturbation signal $I/V_{PTRB}$.

17. A method as claimed in claim 1 wherein the perturbation signal $I/V_{PTRB}$ is selected to disrupt systematic wavelength variations in the optical emission of the semiconductor laser.

18. A method as claimed in claim 1 wherein:
the image pixels are characterized by respective active pixel durations $t_P$; and
the perturbation signal $I/V_{PTRB}$ is configured such that at least one of the different emission modes is selected over respective ones of the active pixel durations $t_P$ for the majority of the image pixels.

19. A method as claimed in claim 1 wherein:
the image pixels are characterized by respective active pixel durations $t_P$; and
the perturbation signal $I/V_{PTRB}$ is configured such that more than one of the different emission modes are selected over respective ones of the active pixel durations $t_P$ for the majority of the image pixels.

20. A method as claimed in claim 1 wherein:
the output beam is modulated with an image signal characterized by a plurality of encoded data periods; and
the perturbation signal $I/V_{PTRB}$ is configured such that at least one of the different emission modes is selected over each of the encoded data periods $t_P$.

21. A method as claimed in claim 1 wherein:
the output beam is modulated with an image signal characterized by a plurality of encoded data periods; and
the perturbation signal $I/V_{PTRB}$ is configured such that more than one of the different emission modes are selected over respective ones of the encoded data periods $t_P$.

22. A method as claimed in claim 2 wherein the magnitude of the perturbation signal $I/V_{PTRB}$ is systematically changed by a constant amount $\Delta I$ between wavelength recovery portions.

23. A laser projection system comprising a visible light source and a controller, wherein the visible light source comprises at least one semiconductor laser and the controller is programmed to:
generate at least a portion of a scanned laser image by operating the semiconductor laser for optical emission of encoded image data and scanning an output beam of the visible light source across a plurality of image pixels or encoded data periods, at least one parameter of the optical emission being a function of a drive current $I_{GAIN}$ injected into a gain section of the semiconductor laser and one or more additional drive currents $I/V_{PHASE}$, $I/V_{DBR}$, the additional drive signal $I/V_{PHASE}$ applied to a phase section of the semiconductor laser and the additional drive signal $I/V_{DBR}$ being applied to a wavelength selective section of the semiconductor laser; and
alter mode selection in the semiconductor laser as the output beam is scanned across the image pixels or encoded data periods by perturbing at least one of the additional drive currents $I/V_{PHASE}$, $I/V_{DBR}$ with a perturbation signal $I/V_{PTRB}$, the perturbation signal $I/V_{PTRB}$ comprising an amplitude profile that varies significantly enough over time to alter mode selection in the semiconductor laser such that a plurality of different emission modes are selected in the semiconductor laser as the output beam is scanned across the image pixels or encoded data periods.

* * * * *